US 6,728,940 B2

(12) United States Patent
Carelli, Jr. et al.

(10) Patent No.: US 6,728,940 B2
(45) Date of Patent: Apr. 27, 2004

(54) APPARATUS AND METHOD FOR DETERMINING PROCESS WIDTH VARIATIONS IN INTEGRATED CIRCUITS

(75) Inventors: John A. Carelli, Jr., Allentown, PA (US); Malcolm H. Smith, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 100 days.

(21) Appl. No.: 10/053,097

(22) Filed: Jan. 18, 2002

(65) Prior Publication Data

US 2002/0060577 A1 May 23, 2002

Related U.S. Application Data

(62) Division of application No. 09/540,473, filed on Mar. 31, 2000, now Pat. No. 6,373,266.

(51) Int. Cl.[7] ............................ G06F 17/50; G06F 9/45; G06F 9/455
(52) U.S. Cl. ........................................................ 716/5
(58) Field of Search ............................. 716/1, 2, 3, 4, 716/5, 8, 9, 10, 11

(56) References Cited

U.S. PATENT DOCUMENTS 5,917,333 A * 6/1999 Ogawa ........................ 324/769

OTHER PUBLICATIONS

Conroy et al., "Statistical Design Techniques for D/A Converters," IEEE Journal of Solid–State Circuits, vol. 24, No. 4, Aug. 1989, pp. 1118–1128.*
Gray et al., Analysis and Design of Analog Integrated Circuits, 2nd Edition, John Wiley & Sons, New York, pp. 388–391, 394–395, 708.*
Larsen et al., "A Test Structure for Extraction of Resistance Matching Properties," 1994 IEEE Int'l Symposium on Circuits & Systems, pp. 209–212.*
Larsen et al., "A Versatile Structure for On–Chip Extraction of Resistance Matching Properties," IEEE Transactions on Semiconductor Manufacturing, vol. 9, No. 2, May 1996, pp. 281–285.*
Michael et al., "Statistical Modeling of Device Mismatch for Analog MOS Integrated Circuits," IEEE Journal of Solid–State Circuits, vol. 27, No. 2, Feb. 1992, pp. 154–166.*

* cited by examiner

Primary Examiner—Leigh M. Garbowski
(74) Attorney, Agent, or Firm—Duane Morris LLP

(57) ABSTRACT

The present invention provides a method and apparatus for determining when an actual width of a resistor in an integrated circuit varies from a design width for that resistor due to process variations. The method and apparatus may be used to determine an actual amount of the process width variation. This amount may be used to effectively match resistors in an integrated circuit that do not have identical design width. The determination of process width variation in an integrated circuit may be used to match the bias resistor of a integrated current steering digital to analog converter to the converter's output resistors.

15 Claims, 7 Drawing Sheets

APPARATUS AND METHOD FOR DETERMINING PROCESS WIDTH VARIATIONS IN INTEGRATED CIRCUITS

CROSS-REFERENCE TO RELATED APPLICATIONS

This application is a divisional application of U.S. patent application Ser. No. 09/540,473 to John A. Carelli Jr. and Malcolm H. Smith, filed Mar. 31, 2000, entitled "Apparatus and Method for Determining Process Width Variations in Integrated Circuits, now U.S. Pat. No. 6,373,266 issued Apr. 16, 2002."

FIELD OF THE INVENTION

The present invention is related to detecting process variations in integrated circuits, and more specifically to the detection of and compensation for process variations in resistors in integrated circuits.

DESCRIPTION OF THE RELATED ART

Integrated circuits often include dozens, hundreds, or millions of electronic components. Resistors in integrated circuits are usually implemented using either diffused regions in the silicon substrate or depositing thin films on the wafer surface. Resistors in integrated circuits can be formed in a variety of patterns, such as straight patterns or right angled zig-zag patterns, from individual square or rectangular resistive areas. Regardless of the pattern, the resistance of the resistor depends on the dimensions and number of the resistive areas included in the resistor. For purposes of explanation, the resistor may be considered a rectangle.

It is known in the integrated circuit fabrication field that the resistance of a resistor in an integrated circuit is related to the dimensions of the resistor and the resistivity of the material used to create the resistor. The resistance of a resistor in an integrated circuit equals the sheet resistance of the material used to form the resistor multiplied by the length of the resistor and divided by the width of the resistor. The sheet resistance is simply the resistivity of the material used divided by the depth of the resistor. Therefore, the resistance of a particular resistor varies inversely with its width, i.e., as width increases, resistance decreases and as width decreases, resistance increases.

Analog circuit designs often depend upon well defined resistor values for proper operation. In practice, the actual resistance of a resistor may vary from a design target width due to process variations that occur during fabrication. Component values can vary greatly, even within the acceptable tolerances for process variations. Because of process variations, it is difficult to control the width of a resistor designed to have a narrow width within tolerances which prevent appreciable modification in resistance. Increasing the width of such a resistor limits this effect, but if the target resistance value is high, the overall size of the resistor becomes unacceptably large due to the increased length needed to achieve the high resistance value.

The most common technique for making a design immune to resistance variation is to use matching resistors which track each other for process variations. This technique is generally useful, but it requires having identical resistors. Process variations tend to occur rather uniformly throughout a substrate, but differences may occur between specific locations on a substrate. Resistors which are matched to each other undergo equivalent changes in resistance from a design resistance due to process variations. Balancing resistors are usually placed in different part of a circuit with the thought that the effect of variations will track in each. The balance essentially cancels out the effect of the variation as the circuit is designed to be sensitive only to the overall balance, not the actual resistance. This technique, however, is less effective when matching narrow resistors because any non-uniform process variations have a greater effect on narrow resistors and impair the ability of a first narrow resistor to track a second narrow resistor, particularly if the narrow resistors are disposed remote from each other on the substrate.

A drawback to the matching technique is that it requires resistors matched to each other to have the same widths, and a narrow resistor, therefore, cannot be effectively matched to a wide resistor because the resistance of the narrow resistor is affected by process variations, such as process width variations, more than the resistance of the wide resistor. This inability to track each other leads to matching errors, which may limit circuit performance. As mentioned, making all of the resistors wide enough to avoid this problem may result in unacceptably large resistors and area sacrifices on the substrate on which the integrated circuit is formed. Also as mentioned, resistors may be matched to each other, but any non-uniform width variations in resistors across a substrate effect narrow resistors that are matched to each other more so than wide resistors that are matched to each other.

It is desirable to match a wide resistor to a narrow resistor rather than pay the area overhead of both resistors having large widths. Therefore, there is a need to be able to determine the amount of process width variation for resistors in an integrated circuit and to account for this variation without relying on matching resistors having identical design widths.

SUMMARY OF THE INVENTION

The present invention comprises a method and apparatus for determining whether an actual width of a resistor in an integrated circuit varies from a design width. A reference resistor having a reference resistor design width and a test resistor having a test resistor design width are provided in an integrated circuit. The reference resistor and the test resistor are sized to have substantially equal resistances at their respective design widths. The reference resistor design width is sized such that the reference resistor is less susceptible than the test resistor to resistance changes due to variations from design width in resistors in the integrated circuit. Substantially equal currents flow from current sources through the test resistor and the reference resistor. A comparator detects a reference voltage across the reference resistor and a test voltage across the test resistor. The output of comparator indicates that the actual width of the test resistor varies from the actual width of the test resistor design width if the reference voltage and the test voltage are not substantially equal.

The method and apparatus may be used to determine an amount of process width variation occurring between the design width of a resistor and the resistor's actual width. This determination may be used to account for process width variations in an integrated circuit and allow matching of resistors in an integrated circuits having different design widths. This, in turn, provides area conservation in integrated circuits. In one embodiment of the present invention, the determined process width variation is used to match resistors in an integrated digital to analog converter.

The above and other features of the present invention will be better understood from the following detailed description of the preferred embodiments of the invention which is provided in connection with the accompanying drawings.

DETAILED DESCRIPTION

As used herein, process width variation refers to the difference between the actual width of a resistor formed as a part of an integrated circuit and the design width of the resistor.

Figure 1:
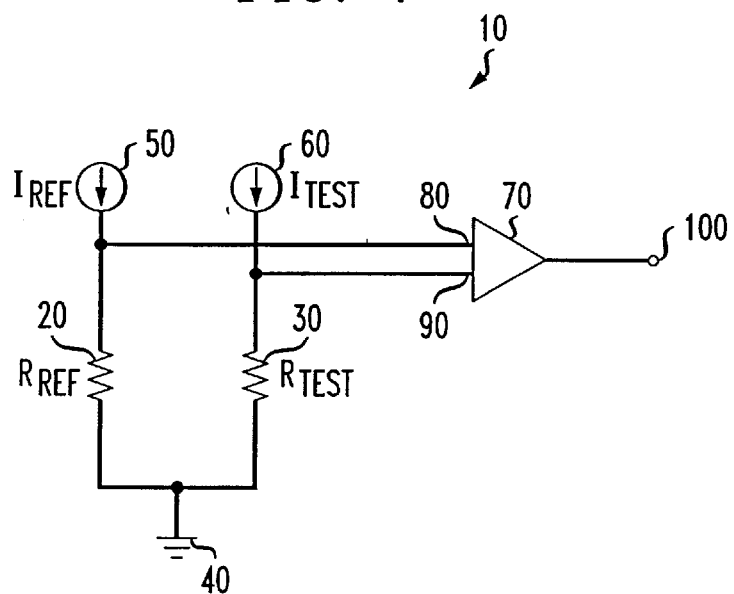
FIG. 1 is diagram of an exemplary embodiment of a circuit according to the present invention for determining whether the actual width of a resistor in an integrated circuit varies from a design width.

FIG. 1 is a diagram of a circuit 10 according to the present invention. It should be understood that the diagram is a functional representation of a circuit that may be formed as a single integrated circuit or as a part of a larger integrated circuit. The circuit 10 includes reference resistor 20 and test resistor 30. Each resistor 20, 30 is connected to a ground 40. The reference resistor 20 is characterized by a reference resistor design width, and the test resistor 30 is characterized by a test resistor design width. The reference resistor 20 and the test resistor 30 are designed to have substantially equal resistances, but the reference resistor design width is sized such that the reference resistor 20 is less susceptible than the test resistor 30 to resistance changes due to variations from design width. This is preferably accomplished by making the reference resistor design width large compared to the test resistor design width and also preferably large compared to an expected process width variation. Accordingly, the test resistor 30 is more susceptible to resistance changes due to variations in the actual resistor widths from design widths.

The reference resistor 20 and test resistor 30 are electrically connected to current sources, reference current source 50 and test current source 60, respectively, which produce substantially equivalent currents. The current sources may be, for example, a MOSFET or BJT. The circuit 10 includes a comparator 70 having a first input 80 electrically connected to the reference resistor 20 and a second input 90 electrically connected to the test resistor 30. The comparator 70 also includes an output 100. A reference voltage drops across the reference resistor 20 as the current from reference current source 50 flows through reference resistor 20. This reference voltage is detected at first input 80 of comparator 70. Likewise, a test voltage drops across test resistor 30 as current from test current source 60 flows through test resistor 30. The test voltage is detected at second input 90 of the comparator 70.

Comparator 70 may be selected to output an electrical signal such as a logical one, or a logical zero if desired, when the voltage at first input 80 is greater than the voltage at second input 90 and a logical zero, or a logical one if desired, when the voltage at first input 80 is less than the voltage at second input 90. A logical one indicates that the actual widths of resistors in the circuit 10, here reference resistor 20 and test resistor 30, are greater than the design widths. As mentioned, the design width for the reference resistor 20 is chosen to be large in comparison to the design width for the test resistor 30 and/or large compared to an expected width variation, and the actual widths vary by approximately equal amounts due to process variations.

Because the reference resistor 20 has the larger design width, it is less susceptible to resistance changes from design resistances due to process width variations. Conversely, the resistance of the test resistor 30 will vary more noticeably with variations from its design width. The resistance of reference resistor 20 remains relatively constant, so the voltage at the first input 80 does not significantly change. The increased width of the test resistor (over its design width) reduces the resistance of the test resistor 30, and thus reduces the test voltage detected at second input 90.

The same analysis applies if the output signal at output 100 is a logical zero. The logical zero indicates that the test voltage is higher than the reference voltage. Therefore, the resistance of the test resistor 30 is greater than the resistance of the reference resistor 20. The increase in resistance of test resistor 30 from its design width indicates that the actual width of the test resistor is below the design width because of process width variations.

As an example, assume that the width of the reference resistor 20 is ten times larger than the width of the test resistor 30. The resistances of the reference resistor 20 and the test resistor 30 are substantially equivalent at their respective design widths, i.e., the reference resistor 20 is longer than the test resistor 30. If the actual widths of both the reference resistor 20 and test resistor 30 deviate from the design widths by an amount equal to a tenth of the test resistor design width, then the resistance of the reference resistor 20 varies by 1% whereas the resistance of the test resistor 30 varies by 10%. Because of the different design widths, the resistance changes for the reference resistor 20 and test resistor 30 do not track each other, and the output 100 of the comparator 70 indicates that actual widths of resistors 20, 30 in the circuit 10, or other resistors formed in an integrated circuit that includes circuit 10, are greater or less than the design widths, as the case may be.

As a further example, assume that normal process width variation is plus or minus 1 um for resistors in an integrated circuit. The design width of a reference resistor may be chosen such that the reference resistor is not highly susceptible to resistance changes due to normal width variation. The desired resistance to change may vary according to design. For example, a design may tolerate a 1% change as sufficiently resistive. The design width of the reference resistor in such a case is then sized at 100 um. The same reference resistor would have a design width of 10 um if the expected process width variation was only plus or minus 0.1 um.

Figure 2:
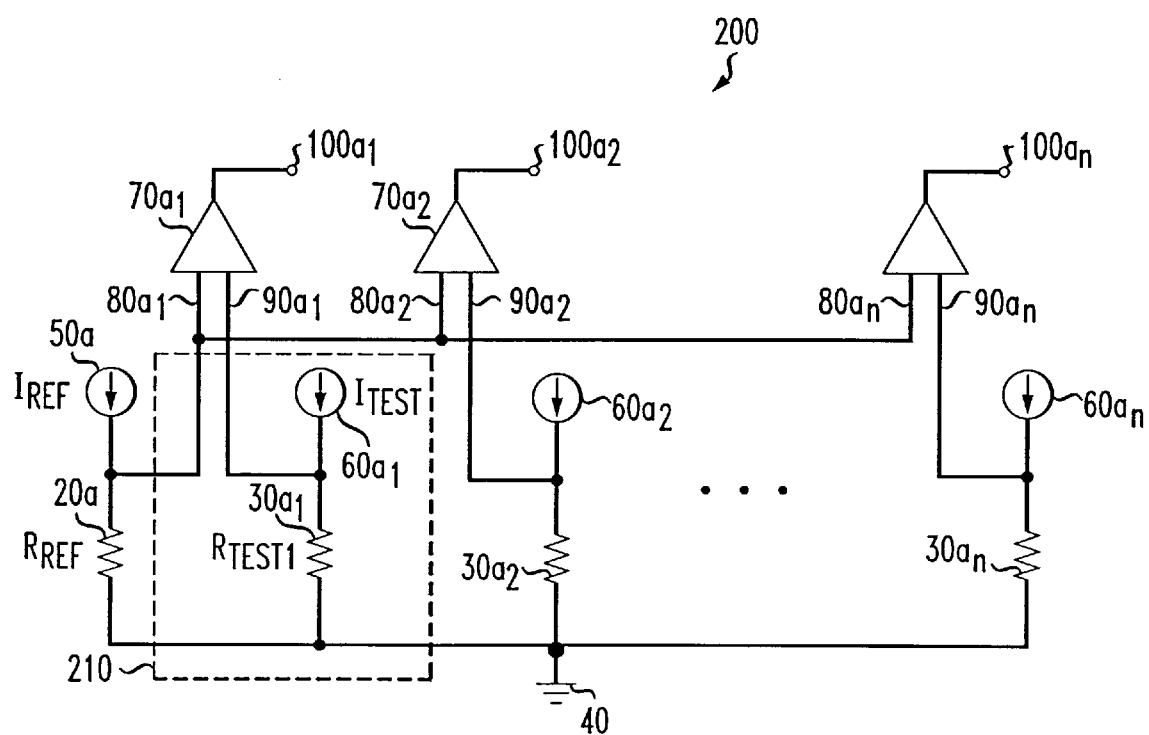
FIG. 2 is a diagram of an exemplary embodiment according to the present invention of a circuit for detecting and determining an amount of process width variation in an integrated circuit.

FIG. 2 is a diagram of an exemplary embodiment according to the present invention of a circuit 200 for detecting and determining an amount of process width variation in an integrated circuit. A reference resistor 20a is connected to a ground 40 and reference current source 50a. The circuit 200 also includes a plurality of test sections 210 and comparators 70a. The first inputs $80a_1$ through $80a_n$ of comparators $70a_1$ through $70a_n$ are electrically connected to reference resistor 20a to detect the reference voltage across reference resistor 20a. Each test section 210 includes a plurality of test current sources $60a_1$ through $60a_n$, each of which produces a current that is substantially equivalent to a current produced by the reference current source 50a.

Each comparator $70a_1$ through $70a_n$ associated with a test section 210 also includes a second input, shown as second inputs $90a_1$ through $90a_n$. The second inputs $90a_1$ through $90a_n$ are electrically connected to test resistors $30a_1$ through $30a_n$ of test sections 210 to detect a voltages dropped across each comparator's associated test resistor 30a. Indeed, each test section 210 is similar, except that each test resistor 30a differs. The test resistors 30a are sized to have substantially equal design widths and depths. Like circuit 10, the design width of the reference resistor 20a is preferably sized to be large compared to the expected process width variation or the design widths of the test resistors 30a. Therefore, it can be assumed that normal process width variations will have negligible effects on the resistance of reference resistor 20a.

The lengths of each of the test resistors $30a_1$ through $30a_n$ differ such that the resistance of each of the test resistors 30a is substantially equal to the resistance of the reference resistor 20a at a different actual width within a predetermined range of expected actual widths. Assuming the process width variation for resistors in the integrated circuit 200, or other resistors on the same substrate as integrated circuit 200, is expected to be within a tolerance range, then the length of test resistor $30a_1$ may be sized such that the resistance of test resistor $30a_1$ is substantially equivalent to the resistance of the reference resistor 20a at either the highest or lowest expected actual width for a test resistor 30a, i.e., the design width for a test resistor 30a plus or minus the greatest expected width variation. Likewise, the length of test resistor $30a_n$ may be sized such that the resistance of test resistor $30a_n$ is substantially equivalent to the resistance of the reference resistor 20a at either the lowest or highest expected actual width for a test resistor 30a, depending upon which extreme was chosen for $30a_1$.

Each test resistor $30a_i$, where i is between 1 and n, has a length such that the resistance of test resistor $30a_i$ is substantially equivalent to the resistance of the reference resistor 20a at a different actual test resistor width between the extremes covered by test resistor $30a_1$ and test resistor $30a_n$. The lengths of test resistors $30a_1$ through $30a_n$ preferably proceed from longest to shortest or shortest to longest so that comparator outputs $100a_1$ through $100a_n$ are logically related, but other combinations are possible as long as it is known which comparator 70a is associated with which test resistor 30a.

The circuit 200 indicates at outputs $100a_1$ through $100a_n$ whether the process width variation is within predetermined limits and, if so, indicates the amount of process width variation. Each test section 210 and associated comparator 70a functions like an individual circuit 10. For example, assume test resistor $30a_1$ has a length sized such that the resistance of test resistor $30a_1$ is substantially equivalent to the resistance of the reference resistor 20a when the actual widths of test resistors 30a are at the largest expected actual width. The length of test resistor $30a_n$ is therefore sized such that the resistance of test resistor $30a_n$ is substantially equivalent to the resistance of the reference resistor 20a when the actual widths of the test resistors 30a are at the smallest expected actual width. Accordingly, the resistors $30a_2$ through $30a_{n-1}$ have lengths preferably incrementally sized such that their resistances are substantially equivalent to the resistance of the reference resistor 20a at different actual widths between the highest and lowest expected actual widths.

In the above example, if the actual widths of the test resistors 30a are above the highest expected actual width, and thus the process width variation is greater than the design tolerances, then all of the test resistors 30a will have smaller resistances than the reference resistor 20a. The first inputs 80a of comparators 70a will detect a reference voltage that is greater than the test voltages detected at second inputs 90a. The outputs 100a will then all indicate logical ones, or logical zeros if the design so provides. The outputs $100a_1$ through $100a_n$ indicate a binary representation that the process width variation is greater than expected and that the actual widths of resistors in the integrated circuit 200 are larger than the design widths.

If the actual widths of the test resistors 20a are below the lowest expected actual width, and thus the process width variation is greater than the design tolerances, then all of the first inputs 80a of comparators 70a will detect a reference voltage that is lower than the test voltages detected at second inputs 90a because resistance increases as resistor width decreases. The outputs 100a will then all indicate logical zeros, or logical ones if the design so provides. In this situation, the outputs $100a_1$ through $100a_n$ indicate a binary representation that the process width variation is greater than expected and that the actual width of resistors in the integrated circuit 200 are smaller than the design widths.

If there are eight test sections (i.e., n=8) in the above example, then the outputs 100a will indicate 11111111 when the process width variation is greater than expected and causes greater actual widths than expected. Conversely, the outputs 100a will indicate 00000000 when the process width variation is greater than expected and leads to smaller actual widths than expected. If the process width variation is within predetermined limits, and therefore the actual widths are within expected limits, the outputs 100a indicate the actual widths. For example, an output of 00011111 indicates that the test voltages detected at inputs $90a_1$, $90a_2$, and $90a_3$ are greater than the reference voltage detected at first inputs $80a_1$, $80a_2$, and $80a_3$. The test voltages detected at inputs $90a_4$ through $90a_8$ are lower than the reference voltage detected at first inputs $80a_4$ through $80a_8$. The signals at outputs 100a of comparators 70a demonstrate that the actual width of the test resistors is between the actual width at which the resistance of test resistor $30a_3$ is substantially equivalent to the resistance of the reference resistor 20a and the actual width at which the resistance of test resistor $30a_4$ is substantially equivalent to the resistance of the reference resistor 20a. Because the binary data indicates a range that includes the actual width, it also indicates the amount the actual width varies from the design width, i.e., the process width variation. The test sections are preferably designed, and the lengths of the test resistors 30a sized, such that a 00001111 output occurs at or around the design width.

The accuracy of the determination of process width variation increases as the number of test sections 210 in circuit 200 increases. For example, if sixteen test sections were used in the above example to cover the same predetermined expected actual width range, twice as many actual widths could be determined within that range.

Figure 3:
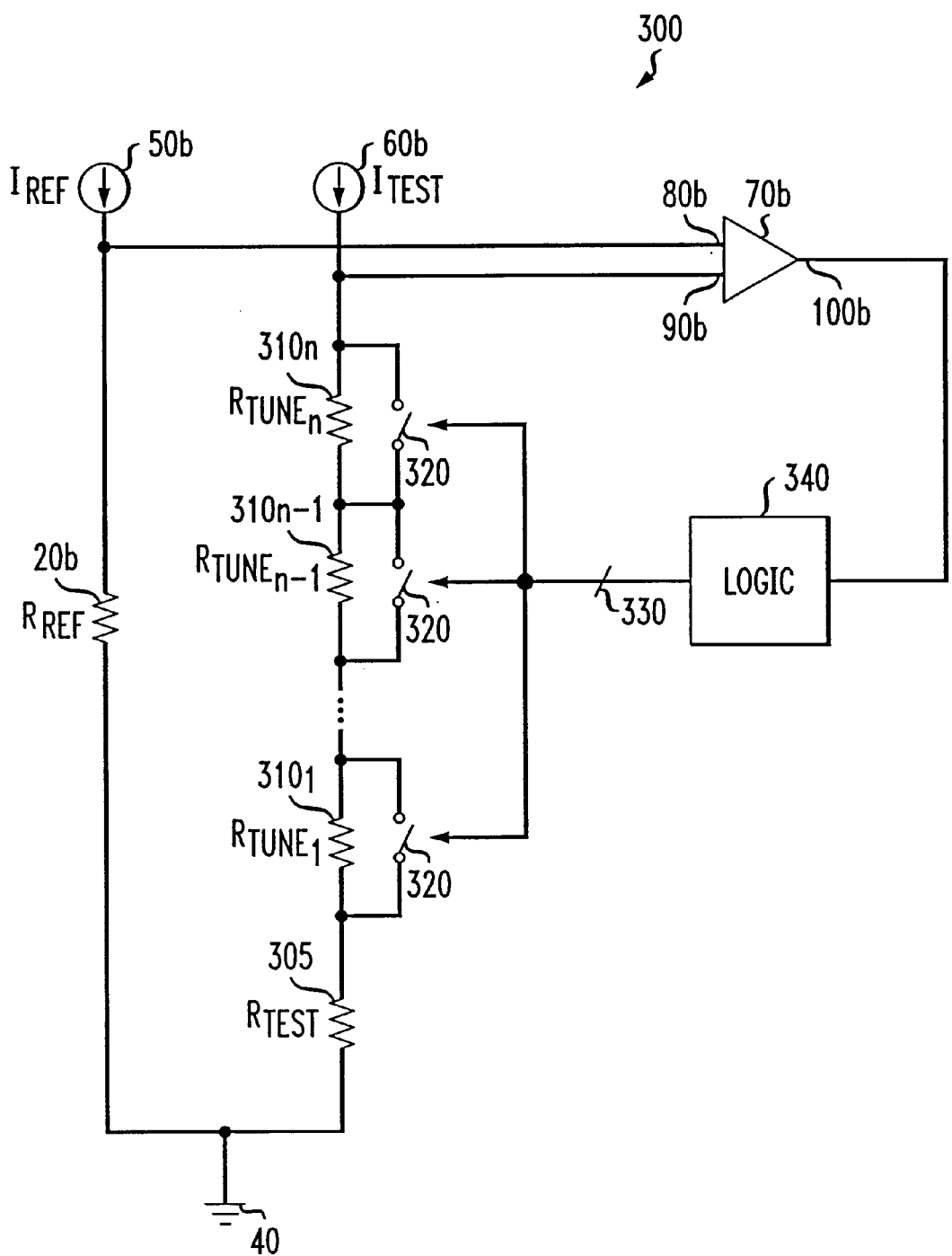
FIG. 3 is a diagram of another exemplary embodiment according to the present invention of a circuit for detecting and determining an amount of process width variation in an integrated circuit.

FIG. 3 is diagram of another circuit according to the present invention for detecting and determining an amount of process width variation in an integrated circuit. Circuit 300 includes a reference resistor 20b electrically connected to reference current source 50b and ground 40. The reference resistor 20b is also electrically connected to a first input 80b of comparator 70b in order to detect a reference voltage across reference resistor 20b.

A test current source 60b preferably produces a test current that is substantially equivalent to the current produced by reference current source 50b. The test current source 60b is electrically connected to ground 40 through a test series of resistors. The test series of resistors includes a test resistor 305 disposed in series with a plurality of tuning resistors 310. Like circuit 10 and circuit 200, the design width of the reference resistor 20b is preferably large in comparison to design widths for resistors 305, 310 of the test series. The design width of reference resistor 20b is chosen to be large enough that normal process variations in its width will have a negligible effect on the resistance of reference resistor 20b.

Circuit 300 also includes a plurality of switches 320. Each of the switches 320 is disposed in parallel with a different tuning resistor 310. The switches 320 are disposed such that closing a switch 320 effectively shorts an associated tuning resistor 320 from the test series. Opening a switch 320 adds a tuning resistor 310 to the test series. Closing all of the switches 320 makes the resistance of the test series equal to the resistance of test resistor 305. Opening all of the resistors makes the resistance of the test series equal to the sum of the resistance of test resistor 305 and the resistance of tuning resistor $310_1$ through tuning resistor $310_n$, where n is the total number of tuning resistors.

The test series is electrically connected to second input 90b of comparator 70b so that comparator 70b detects the voltage across the test series. There are preferably an even number of tuning resistors 310. The tuning resistors are preferably formed to have substantially equal lengths, design widths, and depths. The resistors 305, 310 in the test series should be sized such that the total resistance of test resistor 305 in series with half of the tuning resistors is substantially equivalent to the resistance of the reference resistor 20b at design widths for the resistors. The test resistor 305 should have a test resistance then that is lower than the resistance of the reference resistor 20b. Therefore, when half of the switches 320 are closed and half of the switches 320 are open, and the actual widths of the resistors in the integrated circuit equals the design widths, i.e., zero process width variation, the resistance of the test series is substantially equivalent to the resistance of the reference resistor 20b.

There are several ways to determine process width variations using the circuit 300. Half of the switches 320 are preferably initially closed and half of the switches 320 are preferably initially open. A test series voltage is detected at second input 90b and an output signal at 100b indicates whether the voltage at the first input 80b is higher than the voltage at the second input 90b. If the voltage at 80b is higher than the voltage at 90b, then the resistance of the reference resistor 20b is higher than the resistance of the test series and, therefore, the actual widths of the resistors in the circuit 300 are higher than the design widths. Conversely, if the voltage at 80b is lower than the voltage at 90b, then the resistance of the reference resistor 20b is less than the resistance of the test series, and the actual widths of the resistors in the integrated circuit are lower than the design widths.

The output signal at output 100b is electrically coupled to logic section 340. Logic 340 is connected through a plurality of electrical connections 330 to switches 320. The logic 340 is preferably successive approximation logic. If this is the case, the total number of tuning resistors 310 should be a power of two. When the output signal at 100b indicates that the resistance of the test series is lower than the resistance of the reference resistor 20b, logic section 340 opens half of the closed switches, thereby adding a quarter of the total tuning resistors 310 to the test series. If the output signal at output 110b does not change, then the resistance of the reference resistor 20b is still higher than the resistance of the test series. In that situation, the logic section 340 opens half of the switches 320 that are still closed, thereby adding an eighth of the total tuning resistors 310 to the test series. Conversely, if the resistance of the reference resistor 20b was not greater than the resistance of the test series after half of the closed switches were opened, then the output signal at output 100b switches and logic section 340 closes half of the switches it had opened.

In the manner just described, the circuit 300 will successively open and close switches in response to the output signal at output 100b until the test series resistance approximately matches the resistance of the reference resistor 20b. The process width variation is related to the number of tuning resistors added to or subtracted from the test series, i.e., the process width variation is greater when a larger number of tuning resistors must be added or subtracted to achieve a balance. If there are sixteen tuning resistors 310 and half of the switches are initially closed, then is takes three clock cycles to determine the process width variation. Eight switches are initially closed. Depending upon the output signal at output 100b, either four switches will be opened or closed during the first clock cycle. If four switches are closed, then twelve switches are closed and four switches are open at the end of the first clock cycle. During the second clock cycle, logic section 340 either opens half of the switches it closed or closes half of the switches remaining open, depending on the output of comparator 70b. Assuming half of the remaining switches are closed, fourteen switches are closed and two are open at the end of the second clock cycle. Again, depending on the output signal at 100b, either one of the two switches closed during the second clock cycle is opened or one of the remaining open switches is closed.

It should be apparent that increasing the number of tuning resistors 320 increases the accuracy of the process width determination. Also, logic 340 may include sequential triggering logic. Depending on the initial output signal at 100b, logic 340 may sequentially trigger switches 320 to add or subtract tuning resistors 310 to the test series one resistor at a time until the output signal at 100b switches. If the number of tuning resistors 310 is large, however, this approach may require a significant number of clock cycles.

In this embodiment of the present invention shown in circuit 300, the accuracy of the determination of the process width variation is greater when the width variation causes the resistors 305, 310 to be have resistor widths that are larger than design widths. This occurs because the resistance values for the tuning resistors 310, the resistors that are being switched in an out of the test series, are smaller. When resistance values are smaller, the test series may be matched more effectively to the reference resistor than when the resistance values of the tuning resistors 310 are larger, and a better determination of the process width variation is made from the number of switches triggered to match the resistors.

Figure 4:
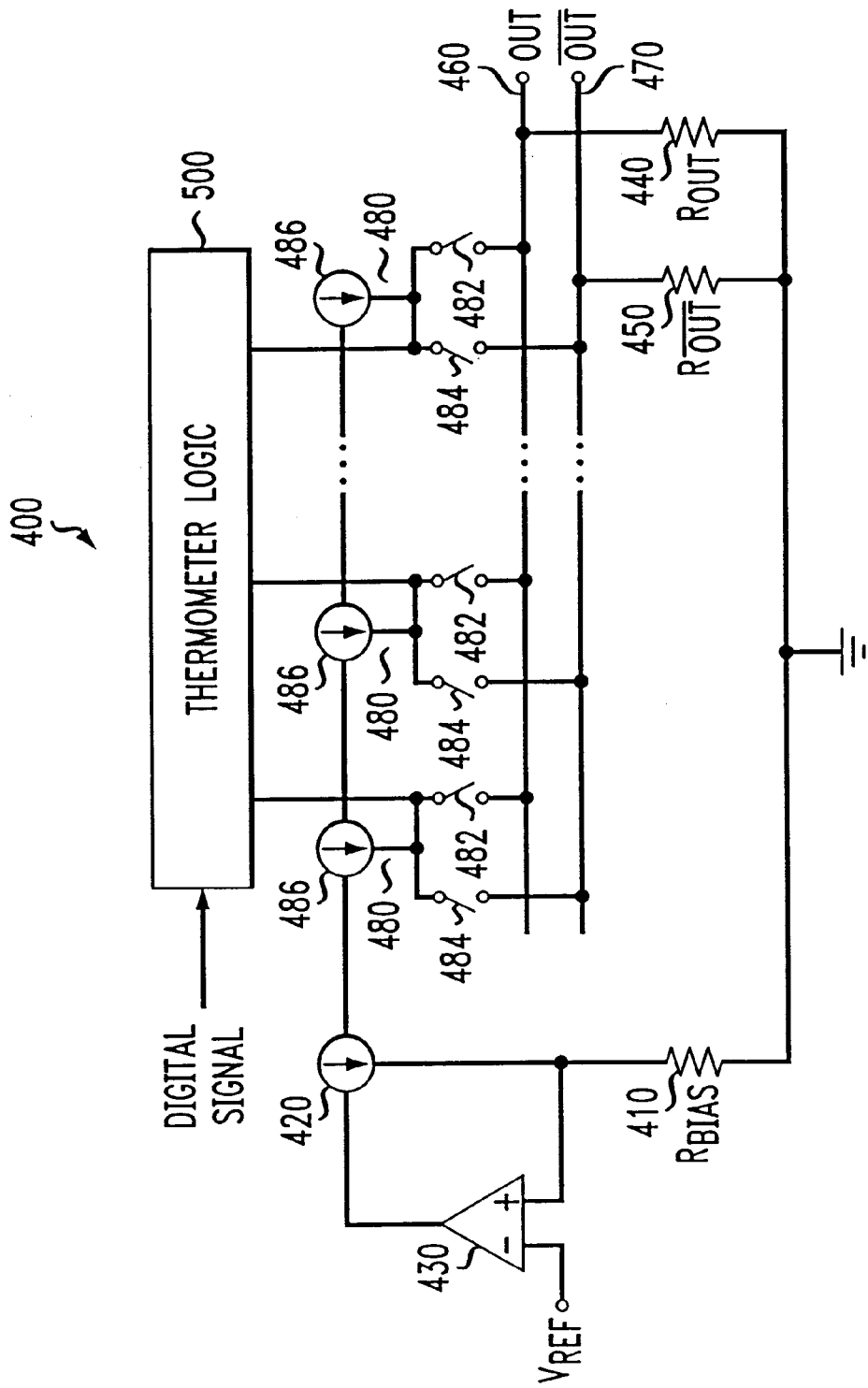
FIG. 4 is a diagram of a prior art current steering digital to analog converter.

FIG. 4 is a circuit diagram representation of a prior art current steering digital to analog converter (DAC) 400. The DAC 400 includes a bias section that includes a bias resistor 410. The bias voltage is generated across bias resistor 410 by driving a current from a bias current source 420 through bias resistor 410. An operational amplifier 430 may be connected to a reference voltage, the bias resistor 410, and the bias current source 420 to regulate the bias current source to insure that the bias voltage mirrors the reference voltage. The operational amplifier 430, for example, may be used to drive the gate of a MOSFET or base of a BJT used as the bias current source 420.

The output resistor section of the DAC 400 includes a first output resistor 440 and a second output resistor 450. The voltage across first output resistor 440 may be measured at first output 460, and the voltage across second output resistor 450 may be measured at second output 470. The output resistors 440, 450 generally have wide design widths so that the first output resistor 440 and second output resistor 450 effectively track each other during process width variations.

The DAC 400 includes a plurality of current mirrors 480. The current mirrors 480 mirror the bias current that generates the bias voltage across bias resistor 410. The current mirrors each include a current sources 486 which is preferably similarly designed to the bias current source 420 and also controlled by the output of the operational amplifier 430. Each mirror 480 includes a first switch 482 that connects the mirror 480 to the first output resistor 440 when triggered and a second switch 484 that connects the mirror 480 to the second output resistor 450 when triggered. The switches may be triggered by a thermometer logic circuit 500 having a plurality of outputs coupled to respective current mirrors 480. In this example, the thermometer logic circuit 500 includes sixteen outputs, each one of the outputs connected to an associated current mirror 480 to trigger switches 484, 482. The thermometer logic circuit accepts the digital signal that is to be converted to an analog signal by DAC 400 and converts the digital signal into a binary thermometer output at its plurality of outputs representative of the value of the digital signal. For example, if the digital input is an unsigned binary 1100, representing a value of 12, then the thermometer logic circuit may convert this value into 1111111111110000, i.e., twelve high outputs and four low outputs. Likewise, a binary 0011 represents a value of 3 and may be converted into 1110000000000000, i.e., three high outputs and thirteen low outputs.

The outputs of the thermometer logic circuit 500 control which switches are triggered in which current mirrors 480. In the above example, twelve first switches 482 are triggered and four second switches 484 are triggered because twelve ones and four zeros are outputted from thermometer logic circuit 500. In this manner, twelve equivalent bias currents from the current mirrors 480 will combine and flow through first output resistor 440. Consequently, the voltage dropped across the first output resistor 440 and measured at first output 460 is the product of the resistance of the first output resistor 440 and the combined currents dumped through switches 482. Four equivalent bias currents will combine and flow through the second output resistor 450. Consequently, the voltage dropped across the second output resistor and measured at second output 470 is the product of the resistance of second output resistor 450 and the combined currents.

The bias resistor 410 typically has a large resistance value in order to keep the bias current reasonably small. In order to make the value of the resistance large and the area consumed by the bias resistor 410 small, it is desirable to make the width of the bias resistor small. A small width value for the bias resistor, however, makes the bias resistor susceptible to variations from its design width. The bias resistor 410, then, is unable to track the output resistors 440, 450, leading to mismatch between the resistors evidenced by gain errors.

Figure 5:
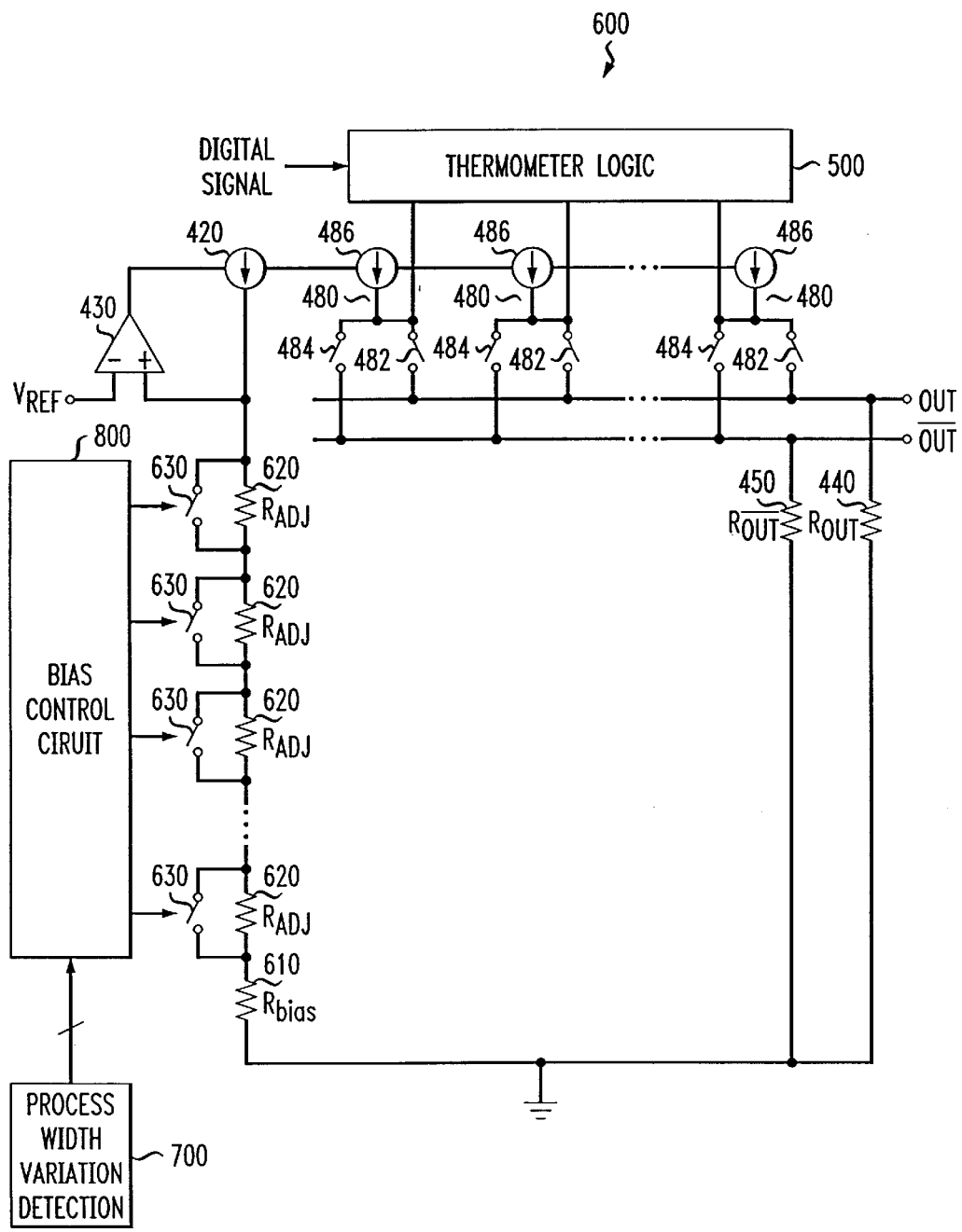
FIG. 5 is a diagram of an exemplary embodiment of a current steering digital to analog converter according to the present invention.

FIG. 5 is a diagram of an exemplary embodiment of a current steering DAC 600 according to the present invention. It should be apparent from FIG. 5 that the construction and function of the DAC 600 is similar to that of the DAC 400 of FIG. 4 except for the bias section. The bias section of DAC 600 includes a bias resistor series. The bias resistor series includes a bias resistor 610 and a plurality of adjustment resistors 620 connected in series with the bias resistor 610. The DAC 600 includes a plurality of switches 630. Each of the switches 630 is connected in parallel with a respective adjustment resistor 620. Closing a switch 630 shorts the respective adjustment resistor 620 from the bias series. Opening a switch 630 adds a respective adjustment resistor 620 to the bias series.

The DAC 600 may include a process width variation detection circuit 700. The detection circuit 700 may be, for example, apparatus 200 of FIG. 2 or the apparatus 300 of FIG. 3. The detection circuit 700 determines the amount of width variation of resistors in the integrated circuit from design widths by testing resistors formed in an integrated circuit that includes DAC 600. The output of the detection circuitry 700 may be connected to bias control circuit 800. Control circuit 800 triggers the switches 630 to balance the resistance of the bias resistor series to the resistance of the output resistors 440, 450 based on the amount of width variation determined by detection circuit 700.

DAC 600 is only one example where a narrow resistor may be matched to a wide resistor in an integrated circuit based on a determination of process width variation. It should be apparent to one of ordinary skill in analog circuit design that the described methods and apparatuses may be used to match resistors formed in other analog integrated circuits, such as an analog to digital converter.

Further, matching and the determination of process width variations may occur simultaneously. For example, when an integrated circuit is connected to its power source, the same circuit that matches a first resistor to a second resistor and accounts for process width variations by triggering switches until a balance is achieved, also determines the amount of process width variation. The number of adjustment resistors added or subtracted may be used elsewhere in the integrated circuit to match other resistors.

It should also be apparent that a circuit 200 or circuit 300 may be placed at a single location on an integrated circuit. Once the circuit determines an amount of process width variation, this determination is preferably used to match resistors at multiple locations in the integrated circuit. An individual determination does not have to be made for each pair of resistors that are to be matched. Therefore, although circuit 200 or circuit 300 consume a finite amount of substrate space, the circuits ultimately conserve space on the substrate because the process width determination allows a plurality of narrow resistor series to replace a number of wide resistors.

Figure 6:
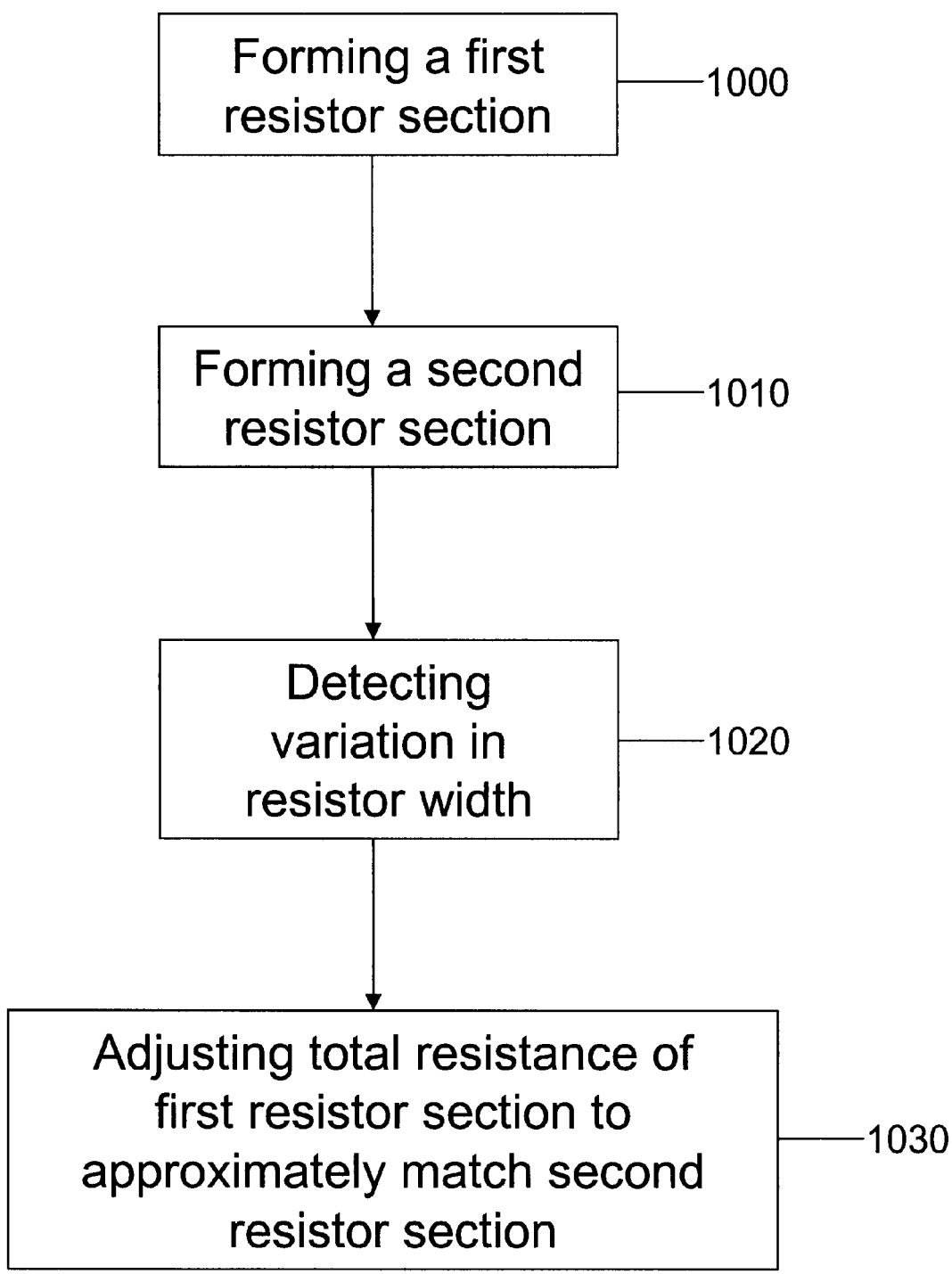
FIG. 6 is a flow chart illustrating an exemplary method of matching resistances of resistor sections.

FIG. 6 is a flow chart illustrating an exemplary method of matching resistance of resistor sections, as described above in connection with, for example, the DAC of FIG. 5. A first resistor section is formed having at least one resistor (e.g., bias resistor 610 and adjustment resistors 620) (step 1000). A second resistor section is formed that has at least one resistor (e.g., resistor 440) (step 1010). The first resistor section is configured to exhibit a greater change in resistance in response to a variation in resistor width from a design width thereof than the second resistor section. A variation in resistor width from design with for the integrated circuit is detected (step 1020) using, for example, process width variation detection circuitry 700. The total resistance of the first resistor section is adjusted to approximately match the total resistance of the second resistor section based upon the variation detected at step 1020 (step 1030), e.g., using, for example, bias control circuit 800 and switches 630.

Figure 6A:
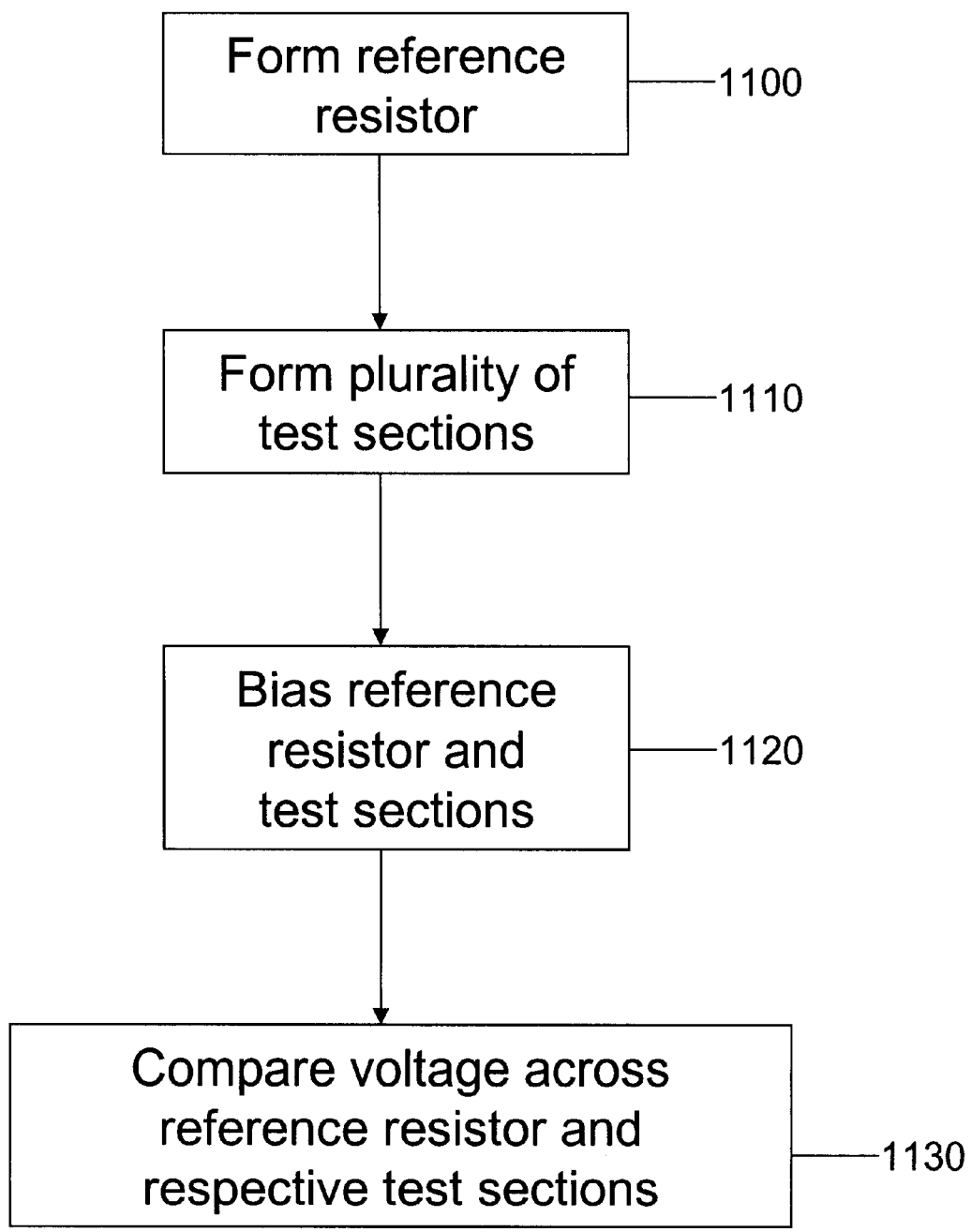
FIG. 6A is a flow chart illustrating a first embodiment of a method of determining variation of the actual widths of resistors from design widths.

FIG. 6A is a flow chart illustrating a first embodiment of a method of determining variation of the actual widths of resistors from design widths. A reference resistor is formed having a reference resistor design width (step 1100). For example, reference resistor 20a of FIG. 2 is formed. A plurality of test sections, as also described in connection with FIG. 2, for example, are also formed at step 1110. The reference and test sections are biased such that substantially equal currents flow through the reference and test resistors (step 1120). Using, for example, comparators 100a (FIG. 2), a voltage across the reference resistor is compared with a respective voltage across each (or some) of the test resistors to determine whether each respective voltage is greater or less than the voltage across the reference resistor (step 1130). The comparisons identify an actual width from a predetermined range of expected widths, thereby identifying the variation in actual widths of resistors in the integrated circuit from design widths.

Figure 6B:
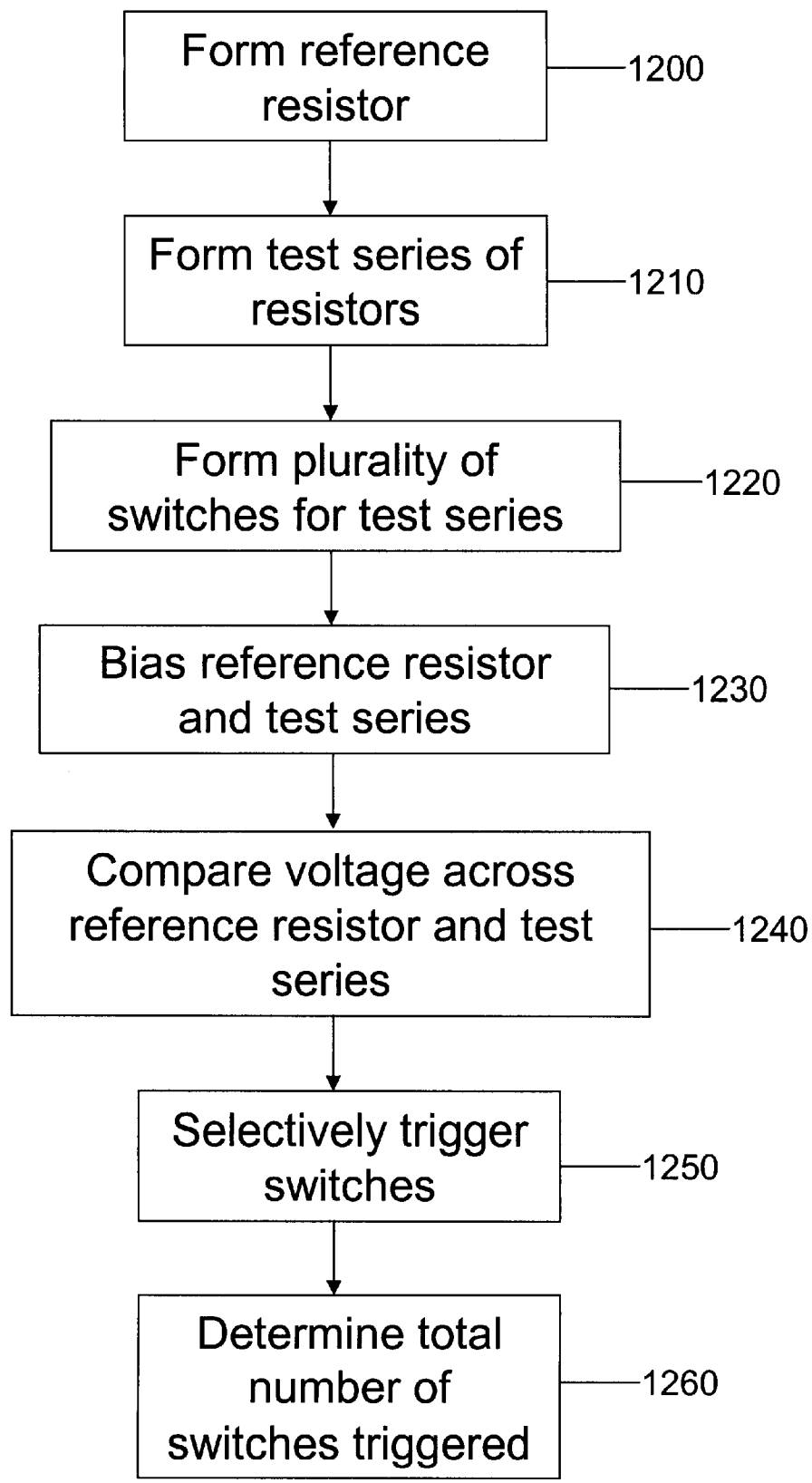
FIG. 6B is a flow chart illustrating a second embodiment of a method of determining variation of the actual widths of resistors from design widths.

FIG. 6B is a flow chart illustrating a second embodiment of a method of determining variation of the actual widths of resistors from design widths. A reference resistor having a reference resistor design width is formed (step 1200). For example, reference resistor 20b of FIG. 3 is formed. A test series of resistors, as shown for example by test resistor 305 and tuning resistors 310, is also formed (step 1210) along with switches disposed in parallel with the tuning resistors (step 1220). The reference resistor and test series are biased such that substantially equal currents flow through the reference resistor and test series (step 1230). A voltage across the reference resistor is compared with a voltage across the test series (step 1240) by, for example, comparator 100b. At least one of the switches is selectively triggered by, for example, logic circuitry 340 based upon the comparison (step 1240) until the resistance of the reference resistor approximately matches the resistance of the test series (step 1250). The total number of triggered switches is determined (step 1260) to identify the variation in actual widths of resistors in the integrated circuit from design widths.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. A method of matching a total resistance of a first resistor section to a total resistance of a second resistor section in an integrated circuit, comprising the steps of:
   (a) forming said first resistor section, said first resistor section having at least one resistor;
   (b) forming said second resistor section, said second resistor section having at least one resistor, said first resistor section being configured to exhibit a greater change in resistance in response to a variation in resistor width from a design width thereof than said second resistor section;
   (c) detecting a variation in resistor width from said design width; and
   (d) adjusting said total resistance of said first resistor section to approximately match said total resistance of said second resistor section based upon said variation detected in step (c).

2. The method of claim 1, wherein said first resistor section comprises a main resistor and a plurality of tuning resistors and the step of adjusting said total resistance of said first resistor section includes the step of adding or subtracting at least one tuning resistor in series with said main resistor.

3. The method of claim 2, wherein the step of adding said tuning resistor includes the step of opening a switch disposed in parallel with said tuning resistor and the step of subtracting said tuning resistor includes the step of closing a switch disposed in parallel with said tuning resistor.

4. The method of claim 1, wherein step (c) includes the following steps:
   (I) forming a reference resistor having a reference resistor design width;
   (II) forming a plurality of test sections, comprising:
      a plurality of test resistors, each of said test resistors being defined by a first end and a second end, a length defined by said first and second ends, a design width, and a depth, said test resistors having substantially equal depths and substantially equal design widths, said lengths of said resistors differing such that the resistance of each of said resistors is substantially equal to the resistance of said reference resistor at a different actual width within a predetermined range of expected widths, said reference resistor design width being sized such that said reference resistor is less susceptible than said test resistors to resistance changes due to variations from design widths;
   (III) causing substantially equal currents to flow through said reference resistor and said test resistors; and
   (IV) comparing a voltage across said reference resistor with a respective voltage across each of said test resistors to determine whether each respective voltage is greater or less than said voltage across said reference resistor,
   wherein said comparisons of step (IV) identify an actual width from said predetermined range of expected widths, thereby identifying said variation in actual widths of resistors in said integrated circuit from design widths.

5. The method of claim 1, wherein step (c) includes the following steps:
   (I) forming a reference resistor having a reference resistor design width;
   (II) forming a test series of resistors, said test series of resistors comprising a test resistor having a test resistor design width disposed in series with a plurality of tuning resistors having substantially equal lengths, design widths, and depths, said reference resistor design width sized such that said reference resistor is less susceptible than resistors in said test series to resistance changes due to variations from design width;
   (III) forming a plurality of switches each disposed in parallel with a different tuning resistor;
   (IV) causing substantially equal currents to flow through said reference resistor and said series;
   (V) comparing a voltage across said reference resistor with a voltage across said test series;
   (VI) selectively triggering at least one of said switches based upon said comparing step (V) until the resistance of said reference resistor approximately matches the resistance of said test series; and (VII) determining a total number of said switches that are triggered, wherein said total number identifies said variation in actual widths of resistors in said integrated circuit from design widths.

6. The method of claim 5, wherein comparing step (V) identifies whether said voltage across said reference resistor is greater than or less than said voltage across said test series, said selectively triggering step including the steps of:

if said voltage across said reference resistor is greater than said voltage across said test series, sequentially opening switches until said voltage across said reference resistor is less than said voltage across said test series; and if said voltage across said reference resistor is less than said voltage across said test series, sequentially closing switches until said voltage across said reference resistor is greater than said voltage across said test resistor.

7. The method of claim 6, wherein a total number of said tuning resistors is a power of two and half of said switches are open and half of said switches are closed prior to step (VI).

8. The method of claim 7, wherein comparing step (V) identifies whether a voltage across said reference resistor is greater than or less than a voltage across said test series, said selectively triggering step including the steps of:

if said voltage across said reference resistor is greater than said voltage across said test series, sequentially opening half of said switches until said voltage across said reference resistor is less than said voltage across said test series; and if said voltage across said reference resistor is less than said voltage across said test series, sequentially closing half of said switches until said voltage across said reference resistor is greater than said voltage across said test resistor.

9. The method of claim 8, wherein the resistance of said test series is substantially equal to the resistance of said reference resistor when an actual width of said reference resistor is substantially equal to said reference resistor design width, a test resistor design width is substantially equal to said test resistor design width, and half of said switches are closed.

10. A method of determining a variation in actual widths of resistors in an integrated circuit from design widths, comprising the steps of:

(a) forming a reference resistor having a reference resistor design width;

(b) forming a plurality of test sections, comprising:

a plurality of test resistors, each of said test resistors being defined by a first end and a second end, a length defined by said first and second ends, a design width, and a depth, said test resistors having substantially equal depths and substantially equal design widths, said lengths of said resistors differing such that the resistance of each of said resistors is substantially equal to the resistance of said reference resistor at a different actual width within a predetermined range of expected widths, said reference resistor design width being sized such that said reference resistor is less susceptible than said test resistors to resistance changes due to variations from design widths;

(c) causing substantially equal currents to flow through said reference resistor and said test resistors; and (d) comparing a voltage across said reference resistor with a respective voltage across each of said test resistors to determine whether each respective voltage is greater or less than said voltage across said reference resistor, wherein said comparisons of step (d) identify an actual width from said predetermined range of expected widths, thereby identifying said variation in actual widths of resistors in said integrated circuit from design widths.

11. A method of determining a variation in actual widths of resistors in an integrated circuit from design widths, comprising the steps of:

(a) forming a reference resistor having a reference resistor design width;

(b) forming a test series of resistors, said test series of resistors comprising a test resistor having a test resistor design width disposed in series with a plurality of tuning resistors having substantially equal lengths, design widths, and depths, said reference resistor design width sized such that said reference resistor is less susceptible than resistors in said test series to resistance changes due to variations from design width;

(c) forming a plurality of switches each disposed in parallel with a different tuning resistor;

(d) causing substantially equal currents to flow through said reference resistor and said test series;

(e) comparing a voltage across said reference resistor with a voltage across said test series;

(f) selectively triggering at least one of said switches based upon said comparing step (e) until the resistance of said reference resistor approximately matches the resistance of said test series; and (g) determining a total number of said switches that are triggered, wherein said total number identifies said variation in actual widths of resistors in said integrated circuit from design widths.

12. The method of claim 11, wherein comparing step (e) identifies whether said voltage across said reference resistor is greater than or less than said voltage across said test series, said selectively triggering step including the steps of:

if said voltage across said reference resistor is greater than said voltage across said test series, sequentially opening switches until said voltage across said reference resistor is less than said voltage across said test series; and if said voltage across said reference resistor is less than said voltage across said test series, sequentially closing switches until said voltage across said reference resistor is greater than said voltage across said test resistor.

13. The method of claim 12, wherein a total number of said tuning resistors is a power of two and half of said switches are open and half of said switches are closed prior to step (f).

14. The method of claim 13, wherein comparing step (e) identifies whether a voltage across said reference resistor is greater than or less than a voltage across said test series, said selectively triggering step including the steps of:

if a voltage across said reference resistor is greater than a voltage across said test series, sequentially opening half of said switches until said voltage across said reference resistor is less than said voltage across said test series; and if a voltage across said reference resistor is less than a voltage across said test series, sequentially closing half of said switches until said voltage across said reference resistor is greater than said voltage across said test resistor.

15. The method of claim 14, wherein the resistance of said test series is substantially equal to the resistance of said reference resistor when an actual width of said reference resistor is substantially equal to said reference resistor design width, a test resistor design width is substantially equal to said test resistor design width, and half of said switches are closed.

* * * * *